United States Patent [19]

Trumpff et al.

[11] Patent Number: 5,023,941

[45] Date of Patent: Jun. 11, 1991

[54] SWITCHING-OVER, AUTOMATIC MATCHING FILTER FOR RADIO TRANSMITTER AND/OR RECEIVER

[75] Inventors: Jean-Michel Trumpff; Michel Byzery; Gilles Raineteau, all of Cholet, France

[73] Assignee: Thomson-CSF, Paris, France

[21] Appl. No.: 310,361

[22] Filed: Feb. 14, 1989

[30] Foreign Application Priority Data

Feb. 17, 1988 [FR] France ................ 88 01859

[51] Int. Cl.⁵ ............................ H04B 1/10
[52] U.S. Cl. ................. 455/307; 333/17.1
[58] Field of Search ........... 455/307, 234, 239, 214, 455/246, 336, 340, 126, 266; 333/103, 17.1

[56] References Cited

U.S. PATENT DOCUMENTS

| | | | |
|---|---|---|---|
| 3,757,236 | 9/1973 | Langan | 333/17.1 |
| 4,466,133 | 8/1984 | Price | 455/303 |
| 4,723,318 | 2/1988 | Marshall | 455/307 |
| 4,776,040 | 10/1988 | Ichikawa et al. | 455/234 |
| 4,792,993 | 12/1988 | Ma | 455/266 |

Primary Examiner—Donald O. Woodiel
Assistant Examiner—Kinfe-Michael Negash
Attorney, Agent, or Firm—Cushman, Darby & Cushman

[57] ABSTRACT

The filter disclosed has a feedback circuit to stabilize the matching frequency $f_o$ at any instant, in acting on the bias current and voltage of the variable capacitance diodes of the filter, when interfering signals have a frequency located in the pass-band of this filter.

4 Claims, 1 Drawing Sheet

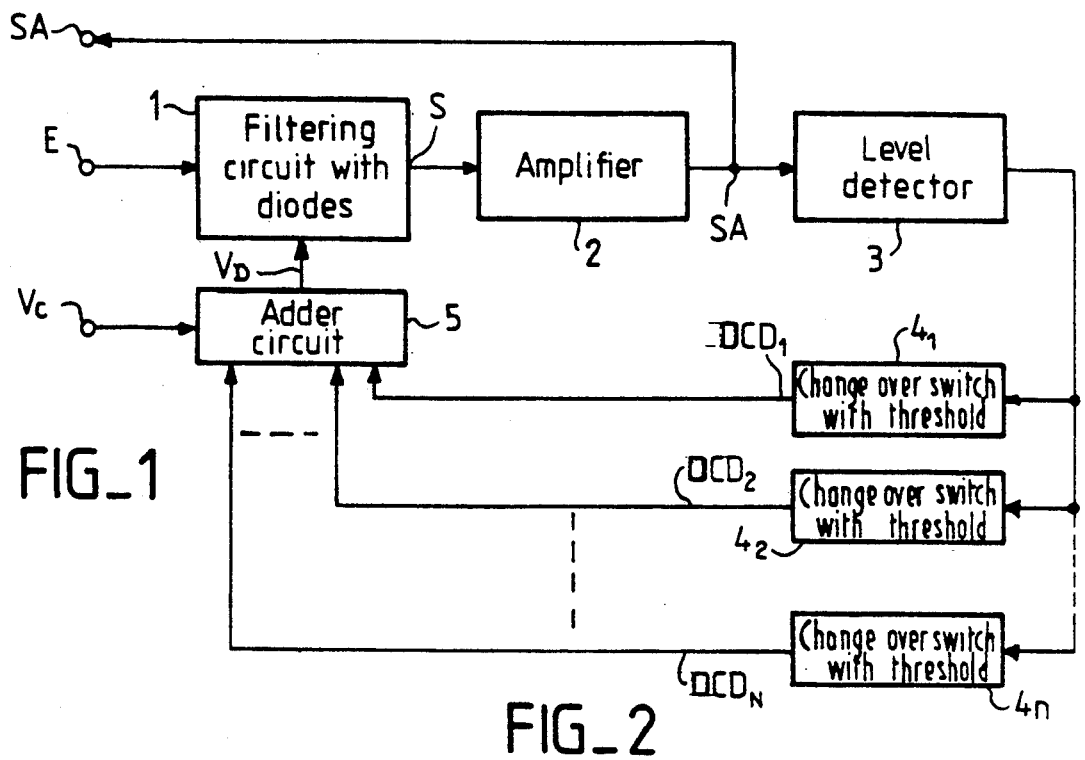
FIG_1
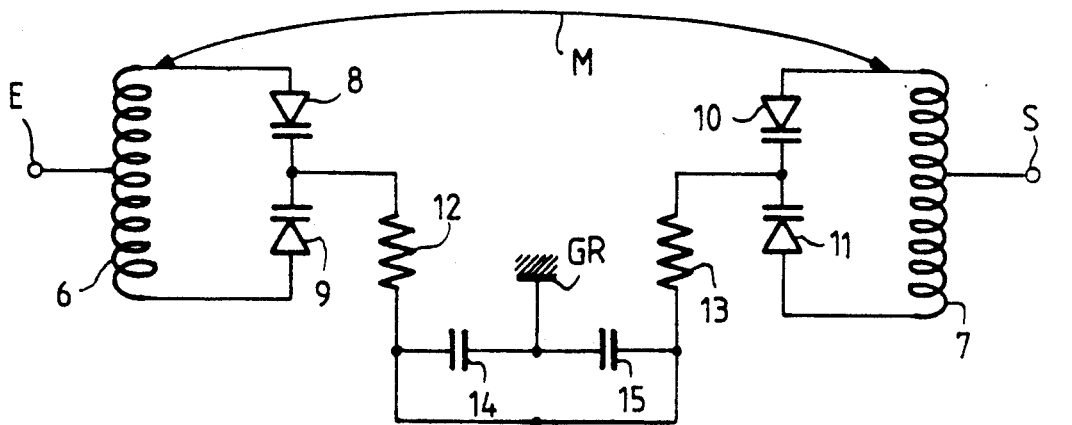
FIG_2
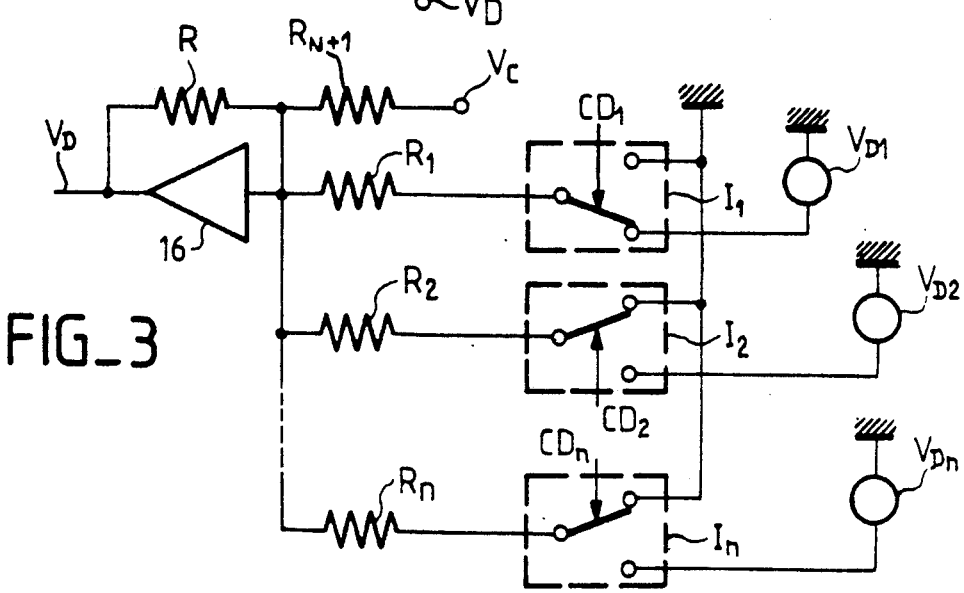
FIG_3

SWITCHING-OVER, AUTOMATIC MATCHING FILTER FOR RADIO TRANSMITTER AND/OR RECEIVER

BACKGROUND OF THE INVENTION

1. Field of the Invention

The present invention concerns a switching-over automatic matching filter for radio transmitter and/or receiver stations.

It can be applied notably to the making of frequency hop switching-over filters.

2. Description of the Prior Art

In prior art techniques for making radio frequency filters, the need to obtain operation that requires only low current consumption, without any modification of the matching frequency of the filter in the presence of an interfering signal, is contradictory to the need to ensure high agility in frequency.

A first category of filters are the filters matched by values of capacitances, switched over by means of PIN diodes. To ensure high agility in frequency, the switching-over operations are done at the matched circuits. However, high current values are used to bias the diodes, in order to avoid damping the resonant circuits of the filter by high resistance values and ensure high immunity to interfering signals.

A second category of filters ar the filters matched by levels of capacitances, switched over by electromechanical relays. These filters consume a great deal of energy through the frequent modifying of their matching frequency, and do not provide for high agility in frequency.

A third category of filters are the band-pass filters, switched over by PIN diodes. These filters call for a great number of band-pass cells to achieve good selectivity. Like the filters of the previous category, they consume a great deal of current, and have the drawback of taking up a great amount of space, in terms of volume, in the equipment.

Finally the fourth category are the filters matched by variable capacitance diodes which permit high agility in frequency with low consumption. Unfortunately, when there are interfering signals caused by nearby transmitting stations, the bias voltage of the variable capacitance diodes is disturbed, causing the mismatching of the filters.

SUMMARY OF THE INVENTION

An aim of the invention is to overcome the above-mentioned drawbacks.

To this effect, an object of the invention is a switching-over, automatic matching filter for a radio transmitter and/or receiver station, of the type comprising a filtering circuit with variable capacitance diodes and a feedback circuit to stabilize the matching frequency $f_o$ of the filter in acting on the bias current and voltage of the variable capacitance diodes when interference signals have a frequency located in the pass-band of the filter.

The main advantage of the invention is that, through the correction of the voltage applied to the variable capacitance diodes, it enables the filter to be kept locked into its matching frequency (also known as tuned frequency). This matching frequency can thus hold up well against the interference signals caused by nearby transmitting stations. Furthermore, the correction system used enables the application of the correction voltage only if there is actually a mismatching of the filter, thus making it possible to automatically eliminate powerful interfering signals which are very close to the matching of the filter. Moreover, the fact that the detection of the level of interference occurs after the filtering device having variable capacitance diodes, and after amplification, enables the detection of only the powerful interference signals close to the matching frequency of the filter. Also, detection after amplification is easier to implement and does not damp the matched filter.

BRIEF DESCRIPTION OF THE DRAWINGS

Other features and advantages of the invention will appear below from the following description, made with reference to the appended drawing, wherein:

FIG. 1 shows a automatic matching filter according to the invention;

FIG. 2 shows an embodiment of the filtering circuit, with variable capacitance diodes, of the automatic matching filter shown in FIG. 1, FIG. 3 shows an embodiment of the adder circuit of the automatic matching filter shown in FIG. 1,

DESCRIPTION OF PREFERRED EMBODIMENTS

The automatic matching filter according to the invention, shown in FIG. 1, has a filtering circuit 1, with variable capacitance diodes, coupled to an amplifier 2 and a level detector 3. The amplifier 2 and the level detector 3 are series connected, in this order, to the input of a set of n change-over switches with threshold, respectively referenced $4_1$ to $4_n$. At their outputs, the change-over switches $4_1$ to $4_n$ deliver control states $OCD_1$ to $OCD_n$ to the control inputs of the computation circuit 5, the function of which is to give a voltage $V_D$ for the control of the matching frequency also known as tuned frequency of the filtering circuit 1 with variable capacitance diodes.

The filtering circuit 1, with variable capacitance diodes, shown in FIG. 2, has a set of two parallel resonant circuits, formed by two inductance coils 6 and 7, respectively matched by two variable capacitance diodes 8-9 and 10-11. The inductance coils 6 and 7 are coupled together by mutual inductance. Their mutual inductance coefficient M is symbolized in FIG. 2.

The diodes 8-9 and 10-11 are series mounted back-to-back, between the ends of the inductance coils 6 and 7; their common end is connected to the ground circuit GR of the filter, respectively through a resistor 12-13 and a capacitor 14 and 15. The ends of the resistors 12 and 13 which are not common with the diodes 8-9 and 10-11 are connected to the output of the adder circuit 5 of FIG. 1, giving the filter matching control voltage $V_D$. The winding of the inductance coil 6 has a midpoint to which the signal E to be filtered is applied. The inductance coil 7 also has a mid-point S, which is connected to the input of the amplifier 2 of FIG. 1.

The computation circuit 5 is shown in FIG. 3. It consists of an operational amplifier 16, mounted as a voltage adder circuit by means of a feedback resistor R and N+1 addition resistors, respectively referenced $R_1$ to $R_{N+1}$ to give a correction voltage. The voltages to be added are applied, by means of the change-over switches $4_1$ to $4_n$, giving the control signals, $CD_1$ to $CD_n$, to switches $I_1$ to $I_n$, which respectively apply, to the non-common ends of the resistors $R_1$ to $R_n$, a zero volt potential or a potential $VD_i$ where the index i is between 1 and n. Finally, in FIG. 3, the end which is not common to the resistor $R_{n+i}$ and the resistors $R_1$ to $R_n$ receives a voltage $V_c$ corresponding to the matching frequency $f_o$ of the filter when there is no interfering signal.

In frequency hopping, the voltage $V_c$ is constantly modified in successive steps, to enable the matching of the filter to each new frequency.

When the interfering signal is not there, the filtering circuit with variable capacitance diodes, shown in FIG. 2, gives a voltage close to zero at the output S forming the mid-point of the winding 7. When there are interfering signals close to the filter matching frequency $f_o$, voltages are developed at the terminals of the variable capacitance diodes 8 to 11, which put the matching of the filter out of balance. However, because of the selectivity of this filter, only the interfering signals close to the frequency $f_o$ develop significant voltages at the output S of the winding 8 and, hence, at the output SA of the reception amplifier 2. These signals are detected by the level detector 3 which, depending on the levels of these signals, positions the change-over switches, $4_1$ to $4_n$, with threshold, by applying the control signals $CD_1$-$CD_n$ to the switches, $I_1$ to $I_n$, of the computing circuit of FIG. 3. These voltages enable the preparation of the voltage $V_d$ by adding, to the voltage $V_c$ for the control of the filter matching frequency without interference signals, the voltage levels $VD_i$ such that the equation:

$$V_D = V_c + \sum_{i=1}^{n} VD_i$$

is verified.

The voltage levels palliate the apparent reduction in the control voltage VC caused by the nearby interfering transmitters, and the use of change-over switches, $4_1$ to $4_n$, with threshold, enables stable control states, $OCD_1$ to $OCD_n$, to be obtained.

What is claimed is:

1. An automatic matching filter for a radio transmitter and/or receiver station, comprising:
    means for filtering first interference signals having a frequency outside at least one pass-band associated with at least one matching frequency to output a filtered signal of said filtering means, said filtering means including variable capacitance diodes for establishing a matching frequency;
    feedback means coupled to said filtering means for stabilizing said at least one matching frequency by supplying to said variable capacitance diodes a feedback voltage to stabilize said at least one matching frequency established by said variable capacitance diodes when second interference signals having a frequency substantially close to and within said at least one pass-band are present.

2. A filter according to claim 1, wherein the feedback means comprises:
    a level detector means for detecting a level of said second interference signals present in said filtered signal, and
    computation means responsive to said detected level for applying said feedback voltage to said variable capacitance diodes of said filtering means to stabilize said matching frequency.

3. A filter according to claim 2, wherein said computation means comprises an adder for adding voltage levels to obtain said feedback voltage, which voltage levels are determined as a function of detected level.

4. A filter according to claim 1 further comprising means for amplifying said filtered signal to obtain an amplified filtered signal; and
    wherein a level detector means receives said amplified filtered signal.

* * * * *